United States Patent [19]

Sims

[11] Patent Number: 4,696,547

[45] Date of Patent: Sep. 29, 1987

[54] WINDOW FOR SHIELDED ENCLOSURE

[75] Inventor: Richard E. Sims, Arlington Heights, Ill.

[73] Assignee: The Curran Company, Addison, Ill.

[21] Appl. No.: 797,708

[22] Filed: Nov. 13, 1985

[51] Int. Cl.⁴ .............................. G02B 5/24; G02B 5/28
[52] U.S. Cl. ...................................... 350/319; 350/312
[58] Field of Search ............... 350/319, 318, 312, 321, 350/322, 418, 419, 279, 331 R, 588; 52/171; 333/12; 204/248; 455/300

[56] References Cited

U.S. PATENT DOCUMENTS

| | | | |
|---|---|---|---|
| 3,443,859 | 5/1969 | Rogers | 350/312 |
| 3,572,907 | 3/1971 | Cindrich | 350/312 |
| 3,912,365 | 10/1975 | Lowell | 350/312 |
| 4,082,892 | 4/1978 | Frump | 52/171 |
| 4,093,352 | 6/1978 | Pisar | 52/171 |
| 4,523,577 | 6/1985 | McClelland | 52/171 |

*Primary Examiner*—John K. Corbin
*Assistant Examiner*—Loha Ben
*Attorney, Agent, or Firm*—Mason, Kolehmainen, Rathburn & Wyss

[57] ABSTRACT

A window for an electromagnetic interference shielded enclosure includes a frame defining a window aperture. A pair of spaced apart, light transmitting, fluid impervious panels are supported by the frame and cover the aperture. In the region enclosed by the frame and the pair of panels, a quantity of light transmitting and electrically conductive fluid is captured. The fluid is electrically connected through the frame to the shield of an enclosure to provide an optically transparent window while maintaining the integrity of the shield.

10 Claims, 3 Drawing Figures

WINDOW FOR SHIELDED ENCLOSURE

The present invention relates to electromagnetic interference shielding and more particularly to a window for a shielded enclosure.

Shielded enclosures are used to attenuate interference from electromagnetic radiation, such as radio frequency radiation. Enclosures such as rooms, boxes or the like are used to meet shielding requirements of applications such as hyperthermia, laser alchemistry, nuclear magnetic resonance and a variety of others. Shielded enclosures in use at the present time may include a single shield of electrically conductive metal and/or metal mesh entirely enclosing a shielded space. In some installations, double shields, either isolated or nonisolated, may be used. The shielding may be grounded to bypass to ground the electromagnetic energy to which the shield is subjected. Where apertures are required in the shield for doors, ventilation, power feedthrus and the like, it is important to maintain the integrity of the shielding.

In some applications of shielded enclosures, it is necessary or desirable to provide a window. One example is an enclosure used with nuclear magnetic resonance or NMR systems. In such systems, the NMR unit is located within the enclosure, while the operator is stationed outside of the enclosure at a console incorporating computer and peripheral equipment. This arrangement avoids interference by the console with the results obtained by the highly sensitive NMR unit. A window is provided through which the operator can observe the NMR unit and a patient.

Typical windows for shielded enclosures used in the past have included one or two fine wire mesh screens electrically connected to the shield or shields of the enclosure. One difficulty with screen windows is that they are not optically transparent. Even with extremely fine wire screens, visibility through the window is impaired. When two screens are employed, the visual interference occurs in waves or patterns which are quite distracting and are aesthetically undesirable.

It is believed that attempts have been made to provide windows for shielded enclosures using glass treated or doped to be electrically conductive. This approach has not been commercially adopted, would be expensive and difficult to carry out, and is of questionable effectiveness.

Among the objects of the present invention are to provide a window for shielded enclosures which may be optically transparent, to provide a window which fully preserves the shielding integrity of a shielded enclosure, to provide a window capable of readily being fabricated from inexpensive and widely available materials and components, to provide a window compatible with the architectural treatment of shielded rooms, and to provide an improved window for shielded enclosures overcoming the disadvantages of those used in the past.

In brief, in accordance with the present invention there is provided a window for a shielded enclosure including a frame defining a window aperture. A pair of spaced apart, light transmitting and fluid impervious panels are supported by the frame and cover the window aperture. A body of light transmitting and electrically conductive fluid is captured between the panels and within the frame.

The present invention together with the above and other objects and advantages may be best understood from the following detailed description of the preferred embodiment of the invention shown in the drawing, wherein.

Figure 1:
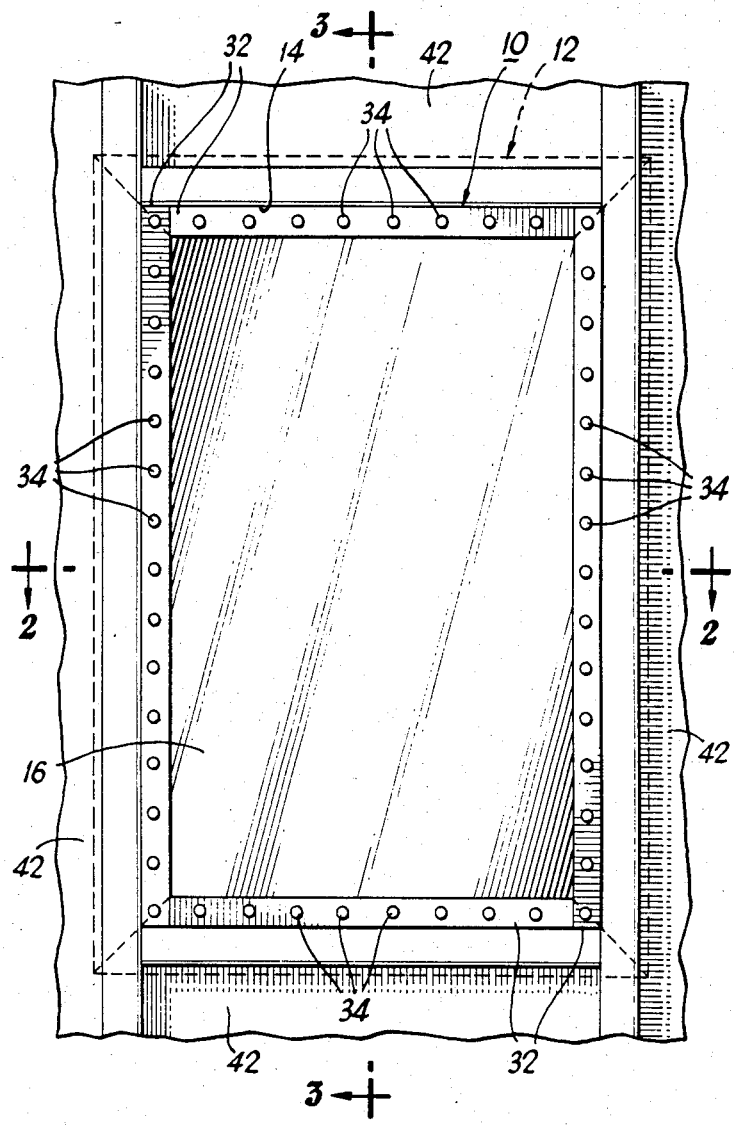
FIG. 1 is an elevational view of a window for a shielded enclosure.
Figure 2:
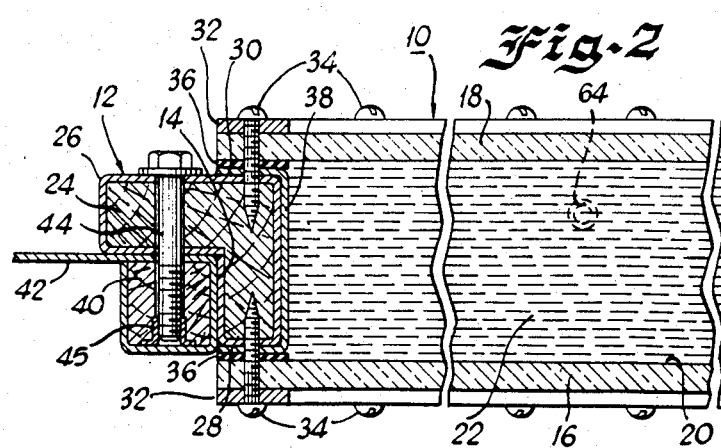
FIG. 2 is a sectional view, partly broken away, on an enlarged scale taken along the line 2—2 of FIG. 1.

Having reference now to the drawing, there is illustrated a window generally designated as 10 constructed in accordance with the principles of the present invention. The window 10 is intended for use with a shielded enclosure as illustrated in FIGS. 1 and 2, and serves to maintain the shielding integrity of the enclosure while being optically clear.

In general, window 10 includes a frame structure 12 suitable for mounting in a window opening 14 of a shielded enclosure. A pair of light transitting panels or panes 16 and 18 are mounted to the opposite sides of frame structure 12. Structure 12 together with panels 16 and 18 defines an enclosed region 20 within which there is contained a body or quantity of electrically conductive fluid 22 electrically connected to the frame structure 12. Panels 16 and 18 and fluid 22 may be transparent and optically clear so that visibility through window 10 is substantially equal to visibility through an ordinary glass window pane.

Proceeding to a more detailed description of the presently preferred embodiment of the invention, frame structure 12 is rectangular in shape and includes a wooden inner frame 24 generally L-shaped in cross section throughout its full periphery. Inner frame 24 is clad or entirely surrounded by a layer or sheet 26 of electrically conductive metal such as copper. If desired, the inner frame 24 and sheet 26 may be replaced with an extruded metal shape. For some applications, it is not necessary that the surface or the entire surface of the inner frame 24 be covered with metal sheet 26.

Panels 16 and 18 are mounted to opposed faces 28 and 30 of frame structure 12 by clamp brackets or flanges 32. Brackets 32 may be similar in outline to panels 16 and 18 and their inner edges may coincide with the inner periphery of the frame structure 12 to provide a neat and trim appearance. Panels 16 and 18 and brackets 32 are held tightly against faces 28 and 30 by a number of screws 34 or other fasteners. Continuous seals 36 disposed between the panels 16 and 18 and the frame structure 12 assure that the enclosed region 20 is leak tight.

In accordance with an important feature of the present invention, the region 20 contains the body or quantity of electrically conductive fluid 22. In the preferred embodiment of the invention, this fluid is an aqueous solution of hydrochloric acid in the range of 0.4 to 0.5 M. However, fluid 22 may consist of or include other electrolytes such as aqueous solutions of other acids or bases. In the preferred embodiment wherein hydrochloric acid is used, frame structure 12 includes a layer or cladding 38 of lead to provide electrical and chemical compatibility with fluid 22. In the preferred embodiment, panels 16 and 18 are formed of a suitable clear plastic material such as Lexan or Plexiglass or of glass.

In most applications of window 10, it is preferred that the window be entirely transparent and optically clear. Consequently, panels 16 and 18 are clear, as is fluid 22. In some installations it may be desired that window 10 have a tinted, colored or light attenuating effect. It may also be desired to provide a translucent rather than a transparent window. For such installations, the material of panels 16 or 18 may be selected accordingly, or the panels may be suitably coated or tinted. Also, if desired, the fluid 22 may take the form of a liquid having a color or tint or a partial light-blocking effect.

Depending upon the size of window 10 and the rigidity of panels 16 and 18, the panels may be slightly deformed by weight or pressure of fluid 22. When this occurs, window 10 may function like a lens to provide a limited degree of magnification. In some instances, this magnification may be desirable. However, in order to avoid magnification, the panels 16 and 18 may be made of a more rigid material, or they may initially be formed with a somewhat concave shape so that they become essentially flat when fluid 22 is introduced into the window. Another alternative is to use groups of smaller panels with a more complex frame or to brace the panels either internally or externally.

One arrangement for mounting window 10 in a typical single shielded enclosure is illustrated in FIG. 2. Support members 40 normally formed of wood are used to frame in the window opening 14. Members 40 are partially or completely covered or clad with a layer 42 of electrically conductive metal such as copper. Layer 42 forms part of or is continuous with the shield of a shielded enclosure. Frame structure 12 fits snugly within the window opening 14 and is held in place by bolts 44 extending through frame structure 12 and through the support members 40 where they are threaded into tee nuts 45 or other fasteners associated with the support members 40.

Bolts 44 produce intimate and large area electrical contact between the metal sheet 26 of frame structure 12 and layer 42 of the enclosure shield. Frame structure 12 completes an electrical circuit between the enclosure shield and the body 22 of fluid since the sheet 26 and layer 38 extend continuously between the enclosed region 20 and the layer 42. As a result, when window 10 is installed, the integrity of the electromagnetic shielding is maintained. If desired, other conductive components may be associated with frame structure 12 to interconnect the shield and the fluid 22.

For maximum attenuation of incident radiation, it is preferred that the entire inwardly directed face 46 of frame structure 12 between panels 16 and 18 be covered or clad with a conductive metal layer such as sheet 26 or layer 38. It is also preferred that this entire inner face throughout the full periphery of frame structure 12 be fully in contact with or wetted by the body 22 of conductive fluid.

Figure 3:
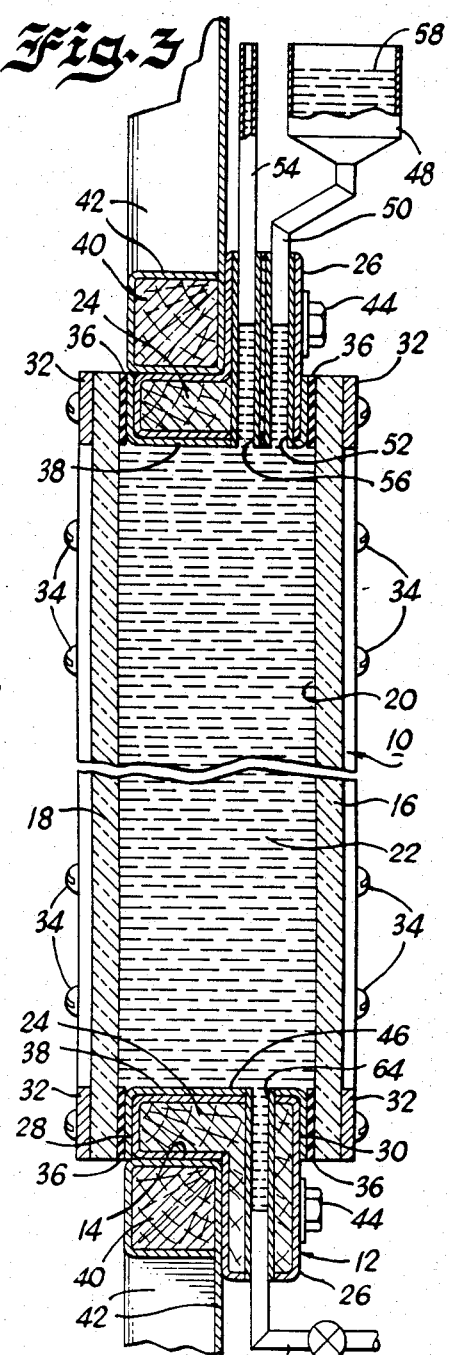
FIG. 3 is an enlarged sectional view taken along the line 3—3 of FIG. 1 including a diagrammatic illustration of fluid connections made to the window.

One arrangement for assuring and maintaining complete filling of region 20 is illustrated in partly diagrammatic form in FIG. 3. A container 48 communicates with region 20 through a conduit 50 and a fluid port 52 formed in frame structure 12. A stand pipe 54 also communicates with region 20 through a fluid port 56. Container 48 and stand pipe 54 may, for example, be concealed within the walls of a shielded room. Liquid may be maintained in container 48, for example, at the liquid level designated as 58. Stand pipe 54 permits the escape of air from region 20 during filling of the region, and liquid rises to level 58 in stand pipe 54 as well as in container 48. Thus, it is assured that region 20 remains filled to the top so that all of the inner face 46 of frame structure 12 including the top is in contact with liquid 22.

As illustrated in FIG. 3, a drain conduit 60 equipped with a drain valve 62 may communicate through a port 64 with the bottom of enclosed region 20. This permits the region 20 to be emptied of fluid 22 if desired.

The drawing illustrates installation of window 10 in a shielded enclosure having a single shield including a single layer of metal. The window 10 may also be employed in double shielded enclosures of various types. Moreover, one or more shields may be incorporated into a room having finished interior and exterior walls with various architectural treatments. In such installations, additional framing and trim may be used to blend the window 10 architecturally into the finished walls. Some shielded enclosures utilize screen or mesh in place of continuous conductive metal layers such as the layer 42 and terms such as metal shield or metal layer are intended to encompass both types of shield. If desired, the metal sheet 26 associated with frame structure 12 may also be formed of a screen or mesh rather than a solid metal sheet.

While the invention has been described with reference to details of the preferred embodiment, such details are not intended to limit the scope of the invention as defined in the accompanying claims.

What is claimed and desired to be secured by Letter Patent of the United States is:

1. A radio frequency shielded enclosure comprising wall means enclosing an electromagnetic radiation shielded space, said wall means including a substantially continuous metal shield, a window opening in said wall means, and an electrically conductive window in the opening for blocking radio frequency electromagnetic radiation while passing visible light;
    said window including a continuous frame fastened to said wall means and including electrically conductive means in electrical contact with the metal shield;
    a first light transmitting panel attached to said frame facing toward the shielded space, and a second light transmitting panel spaced from said first panel and attached to said frame facing away from the shielded space;
    said frame and panels defining an enclosed window space; and
    an electrolyte in said window space in electrical contact with said conductive means.

2. The enclosure of claim 1 wherein said electrolyte is a liquid.

3. The enclosure of claim 2 wherein said electrolyte is an aqueous solution.

4. The enclosure of claim 2 in which said conductive means comprises a metal surface of said frame including a surface portion entirely covering the surface of said frame in said window space and wherein said liquid fills said window space and contacts all of said surface portion.

5. The enclosure of claim 2, further comprising a liquid container in comminication with said window space for supplying said liquid to said window space.

6. The enclosure of claim 5 further comprising a stand pipe in communication with said window space permitting said container to maintain said window space entirely filled.

7. The enclosure of claim 5, further comprising a drain communicating with said window space.

8. An enclosure as claimed in claim 2, said liquid comprising a solution of hydrochloric acid in water.

9. An enclosure as claimed in claim 2, said panels and said liquid being substantially transparent.

10. An enclosure as claimed in claim 2, each said panel being made of plastic or glass.

* * * * *